(12) United States Patent
Wilson et al.

(10) Patent No.: US 7,962,232 B2
(45) Date of Patent: Jun. 14, 2011

(54) METHODS AND MEDIA FOR PROCESSING A CIRCUIT BOARD

(75) Inventors: Michael F. Wilson, Austin, TX (US); Joe Wiseman, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 11/618,549

(22) Filed: Dec. 29, 2006

(65) Prior Publication Data

US 2008/0185170 A1 Aug. 7, 2008

Related U.S. Application Data

(63) Continuation of application No. 11/537,650, filed on Oct. 1, 2006.

(51) Int. Cl.
*G06F 19/00* (2011.01)
*G06F 17/50* (2006.01)
*G06F 9/455* (2006.01)
*G06F 15/04* (2006.01)

(52) U.S. Cl. ............ 700/97; 700/121; 716/50; 716/51; 716/52; 716/106; 716/118; 716/119; 716/139

(58) Field of Classification Search .......... 700/121, 700/97; 438/4; 716/5, 8, 11, 50–52, 106, 716/118–119, 139
See application file for complete search history.

(56) References Cited

U.S. PATENT DOCUMENTS

| | | | | |
|---|---|---|---|---|
| 4,752,887 A * | 6/1988 | Kuwahara | | 716/15 |
| 5,542,600 A * | 8/1996 | Kobayashi et al. | | 228/102 |
| 5,800,859 A | 9/1998 | Price et al. | | |
| 6,086,627 A * | 7/2000 | Bass, Jr. et al. | | 716/112 |
| 6,141,643 A * | 10/2000 | Harmon | | 704/271 |
| 6,180,215 B1 | 1/2001 | Sprietsma et al. | | |
| 6,339,197 B1 * | 1/2002 | Fushie et al. | | 174/262 |
| 6,446,239 B1 * | 9/2002 | Markosian et al. | | 716/122 |
| 6,643,839 B1 * | 11/2003 | Nishio et al. | | 716/15 |
| 6,651,324 B1 | 11/2003 | Pedretti et al. | | |
| 6,664,483 B2 * | 12/2003 | Chong et al. | | 174/261 |
| 6,665,854 B2 * | 12/2003 | Fujiwara et al. | | 716/15 |
| 6,839,885 B2 * | 1/2005 | Ahrikencheikh | | 716/122 |
| 6,907,589 B2 * | 6/2005 | Frank et al. | | 716/112 |
| 6,938,227 B2 * | 8/2005 | Murphy et al. | | 716/1 |
| 7,199,478 B2 * | 4/2007 | Jung | | 257/786 |
| 7,251,801 B2 * | 7/2007 | Ozawa et al. | | 716/15 |
| 7,353,480 B1 * | 4/2008 | Minacapelli | | 716/122 |
| 7,411,221 B2 * | 8/2008 | Cho et al. | | 257/79 |
| 7,496,878 B2 * | 2/2009 | Kitamura et al. | | 716/132 |
| 7,544,304 B2 * | 6/2009 | Matsumoto et al. | | 216/13 |

(Continued)

OTHER PUBLICATIONS

2008 Signal Integrity Training Classes; 2 pages.*

(Continued)

*Primary Examiner* — Ronald D Hartman, Jr.
(74) *Attorney, Agent, or Firm* — Garrana Tran LLP; Andrea E. Tran

(57) ABSTRACT

A method of processing a circuit board including providing a circuit board having disposed thereon a conductive pattern, the pattern comprising a trace terminating at a terminal and depositing conductive material on the terminal and trace to form a land extending away from the terminal on the trace past a projection line. The method also includes applying a soldermask to the circuit board to form a soldermask opening having an opening edge located at and aligned with the projection line, with the opening framing the terminal and a first portion of the land, and to cover a second portion of the land.

20 Claims, 4 Drawing Sheets

U.S. PATENT DOCUMENTS

| | | |
|---|---|---|
| 7,603,642 B2 * | 10/2009 | Subasic et al. ................. 716/119 |
| 2002/0166696 A1 * | 11/2002 | Chamberlin et al. .......... 174/262 |
| 2004/0040008 A1 * | 2/2004 | Ahrikencheikh ................ 716/15 |
| 2004/0163054 A1 * | 8/2004 | Frank et al. ......................... 716/4 |
| 2004/0168314 A1 | 9/2004 | Pedretti et al. |
| 2006/0000640 A1 * | 1/2006 | Fushie et al. ................... 174/262 |
| 2006/0040532 A1 * | 2/2006 | Ozawa et al. ................. 439/108 |
| 2007/0028202 A1 * | 2/2007 | Kawamichi et al. ............ 716/15 |
| 2007/0148816 A1 * | 6/2007 | Davis et al. .................... 438/106 |

OTHER PUBLICATIONS

PCB Land Pattern Design and Surface Mount Guidelines for QFN Packages; 9 pages.*

Land Repair, Film Adhesive Method; 4 pages.*

* cited by examiner

METHODS AND MEDIA FOR PROCESSING A CIRCUIT BOARD

RELATED APPLICATION DATA

This application is a continuation of U.S. patent application Ser. No. 11/537,650, filed Oct. 1, 2006, the disclosure of which is incorporate by reference.

BACKGROUND

1. Technical Field

The present disclosure relates generally to information handling systems and, more particularly, to circuit boards.

2. Background Information

As the value and use of information continues to increase, individuals and businesses seek additional ways to process and store information. One option available to users is an information handling system. An information handling system generally processes compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A circuit board is an assembly of layers utilized to mechanically support and/or electrically couple internal components within an information handling system (IHS). Alternatives for a circuit board include a printed circuit board (PCB), printed board, printed wiring board (PWB) and etched wiring board. Categories and/or types of circuit boards may include controller boards, daughter cards, expansion cards, motherboards, and network interface cards (NICs). The manufacture or fabrication of a lead free circuit board involves the integration of numerous elements and/or materials in a multi-step process.

SUMMARY

The following presents a general summary of some of the many possible embodiments of this disclosure in order to provide a basic understanding of this disclosure. This summary is not an extensive overview of all embodiments of this disclosure. This summary is not intended to identify key or critical elements of the disclosure or to delineate or otherwise limit the scope of the claims. The following summary merely presents some concepts of the disclosure in a general form as a prelude to the more detailed description that follows.

According to one embodiment of the disclosure, there is provided a method of processing a circuit board in which the method may provide a circuit board having disposed thereon a conductive pattern whereby the pattern may include a trace terminating at a terminal. The method may also include depositing conductive material on the terminal and trace to form a land extending away from the terminal on the trace past a projection line. The method may further include applying a soldermask to the circuit board to form a soldermask opening having an opening edge located at and aligned with the projection line, with the opening framing the terminal and a first portion of the land, and to cover a second portion of the land.

According to another embodiment of the disclosure, there is provided a non-limiting computer-readable medium having executable instructions that when executed by an information handling system may carry out a method of processing a circuit board having disposed thereon a conductive pattern, the pattern including traces terminating at terminals whereby the method may include locating the terminals, identifying terminals meeting criteria to obtain selected terminals and depositing conductive material on the selected terminals to form on each selected terminal a land extending away from the terminal on the trace past a projection line.

According to even another embodiment of the disclosure, there is provided a circuit board which may include a substrate having disposed thereon a conductive pattern, the pattern including a trace terminating at a terminal, a land having a portion positioned on the terminal and extending away from the terminal along the trace. The circuit board may further include a soldermask defining a soldermask opening which may frame the terminal and a first portion of the land, and wherein the soldermask covers a second portion of the land.

BRIEF DESCRIPTION OF THE DRAWINGS

The following drawings illustrate some of the many possible embodiments of this disclosure in order to provide a basic understanding of this disclosure. These drawings do not provide an extensive overview of all embodiments of this disclosure. These drawings are not intended to identify key or critical elements of the disclosure or to delineate or otherwise limit the scope of the claims. The following drawings merely present some concepts of the disclosure in a general form. This, for a detailed understanding of this disclosure, reference should be made to the following detailed descriptions taken in conjunction with the accompanying drawings, in which like elements have been given like numerals.

DETAILED DESCRIPTION

For purposes of this disclosure, an embodiment of an Information Handling System (IHS) may include any instrumentality or aggregate of instrumentalities operable to compute, classify, process, transmit, receive, retrieve, originate, switch, store, display, manifest, detect, record, reproduce handle, or utilize any form of information, intelligence, or data for business, scientific, control, or other purposes. For example, an IHS may be a personal computer, a network storage device, or any other suitable device and may vary in size, shape, performance, functionality, and price. The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to transmit data communications between the various hardware components.

Figure 1:
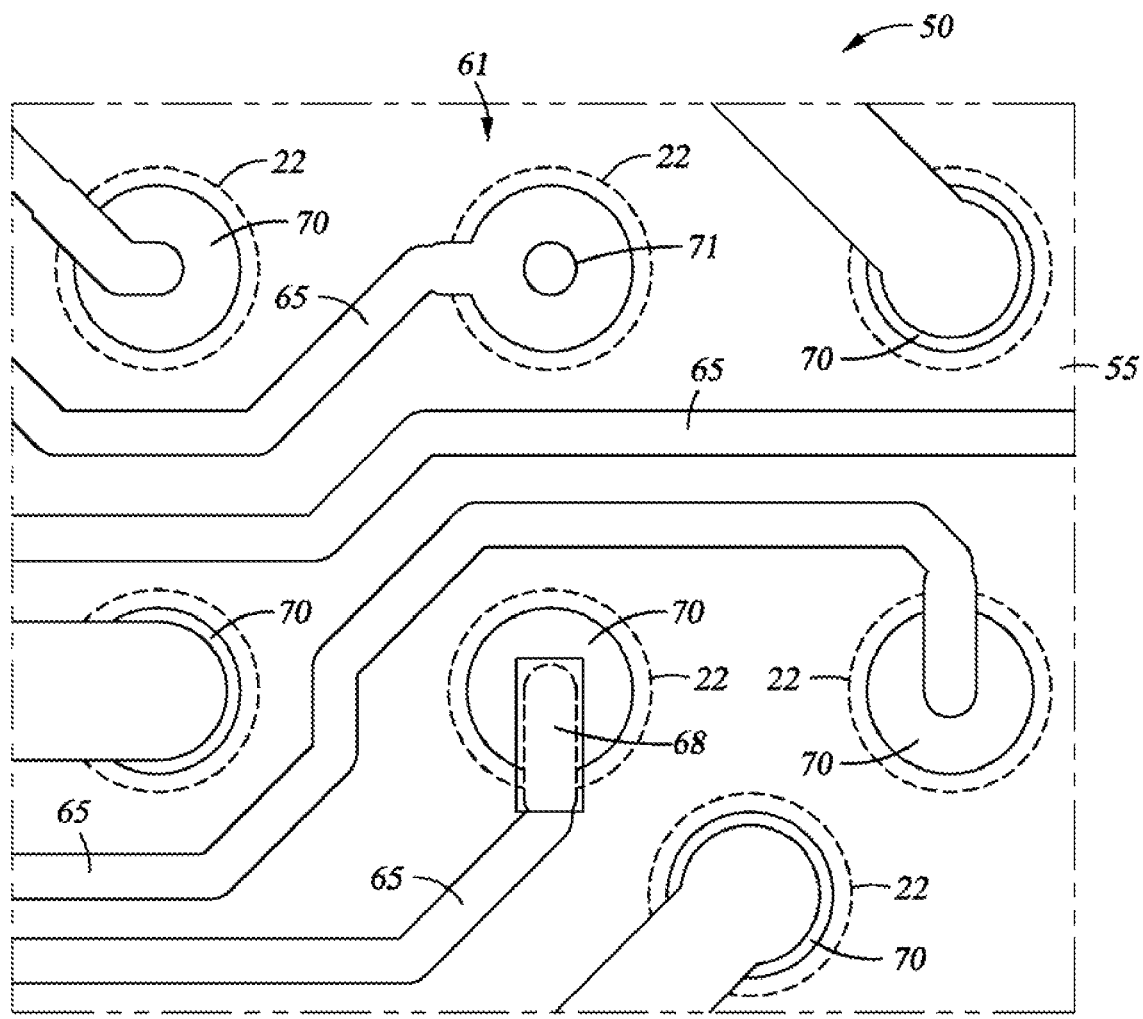
FIG. 1 is a schematic diagram depicting a non-limiting example of a portion of a circuit board which may be included within the hardware components of an IHS.

FIG. 1 is a schematic diagram depicting a non-limiting example of a portion of a circuit board 50 which may be included within the hardware components of an IHS. The circuit board 50 may comprise a substrate 55 onto which a conductive pattern 61 comprising conductive traces 65 is disposed. As a non-conductive foundation, the substrate 55 may consist of any suitable non-conductive material, non-limiting examples of which include composites, fiberglass, epoxy, paper, ceramic and/or plastic. The entire substrate 55 or only its surface to which the conductive pattern 61 is disposed may be formed of the insulating material. Generally, a circuit board 50 may comprise at least one layer of conductive pattern 61 separated and supported by substrates.

Figure 2A:
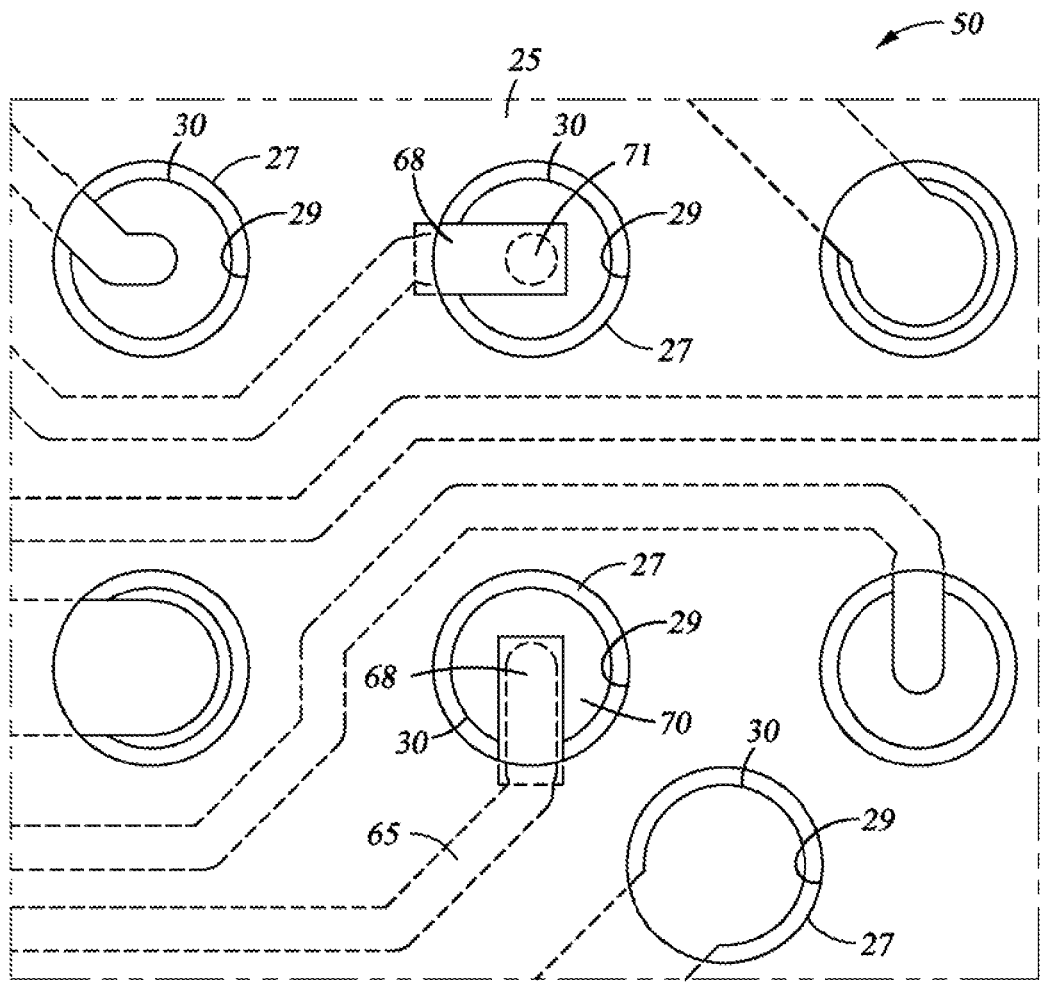
FIG. 2A is shown a non-limiting example of a circuit board to which a soldermask has been applied covering a portion of a conductive pattern on the circuit board (which covered portion is shown as dashed lines).

Referring still to FIG. 1, the conductive pattern 61 disposed on the circuit board 50 may comprise a trace 65 which may comprise a number of terminations at pads 70 or vias 71 collectively referred to herein as "terminals." Traces 65, also called tracks, circuit lines or wires, interconnect electrical components (e.g. resistors, diodes, transistors, etc.) that later in the manufacturing process will be placed on one or both surfaces of the circuit board 50. The traces 65 may be etched from conductive material onto the substrate 55. The pads 70 may be areas of the circuit board 50 for connection and attachment of electronic components whereas vias 71 are holes or apertures in the circuit board 50 for the purpose of layer-to-layer interconnection. Projection lines 22 are not part of circuit board 50 but are provided in FIG. 1 to illustrate positioning of soldermask openings that will be formed in the application of a soldermask (e.g., coating or inert coating). Specifically, the defining edge 29 as seen in FIG. 2A of the soldermask opening 27 that will be formed upon application of a soldermask is located at and aligned with projection line 22. According to the present disclosure, conductive material may be added to certain trace terminals depending upon selection criteria. This conductive material is added forming a land 68 starting from inside pad 70 or via 71 and extending away from pad 70 or via 71 along trace 65 past the projection line 22. In one non-limiting embodiment, this conductive material is added to all pads on a circuit board, and to vias which are testable and which are not be covered by soldermask.

Referring still to FIG. 1, a circuit board may comprise an assembly of the layers previously described. However, for the purpose of this disclosure, it is also understood that a circuit board exists at any stage of a multi-step assembly process provided that at least a substrate layer is present.

Figure 2B:
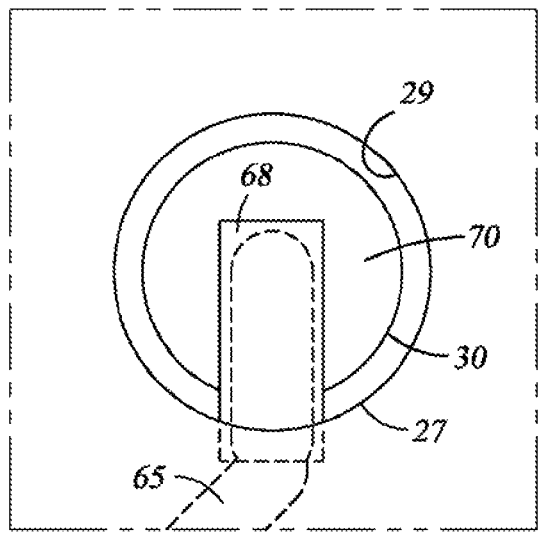
FIG. 2B is shown a non-limiting example of an enlarged isolated portion of a soldermask opening.

Referring to FIG. 2A there is shown circuit board 50 to which a soldermask 25 has been applied covering a portion of the conductive pattern 61 (which covered portion is shown as dashed lines). FIG. 2B is an enlarged isolated portion of one soldermask opening 27 from FIG. 2A. The soldermask 25 defines a number of soldermask openings 27, each of which may outline a corresponding pad 70 or via 71. The soldermask opening 27 may also define an opening edge 29, which follows the contour of and is aligned with the projection line 22. Added land 68 spans from inside pad 70 or via 71 and extends away from the pad 70 or via 71 along the trace 65 past and under the opening edge 29, terminating beneath the soldermask 25. The pad boundary 30 frames the terminals and may be found on either a pad 70 or via 71.

Figure 3A:
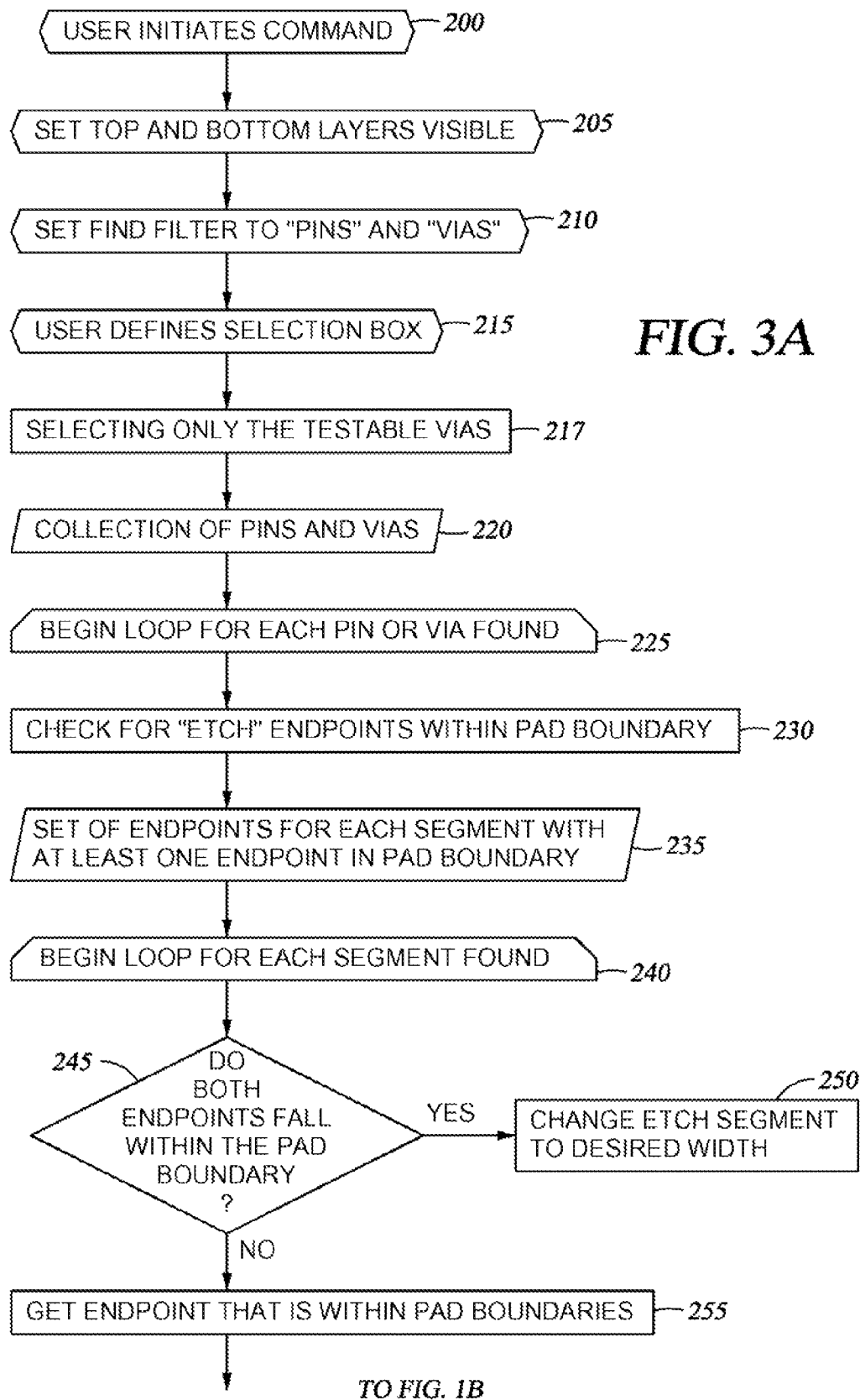
FIGS. 3A and 3B are collectively a flowchart illustrating a non-limiting method embodiment to deposit conductive material onto a circuit board.
Figure 3B:
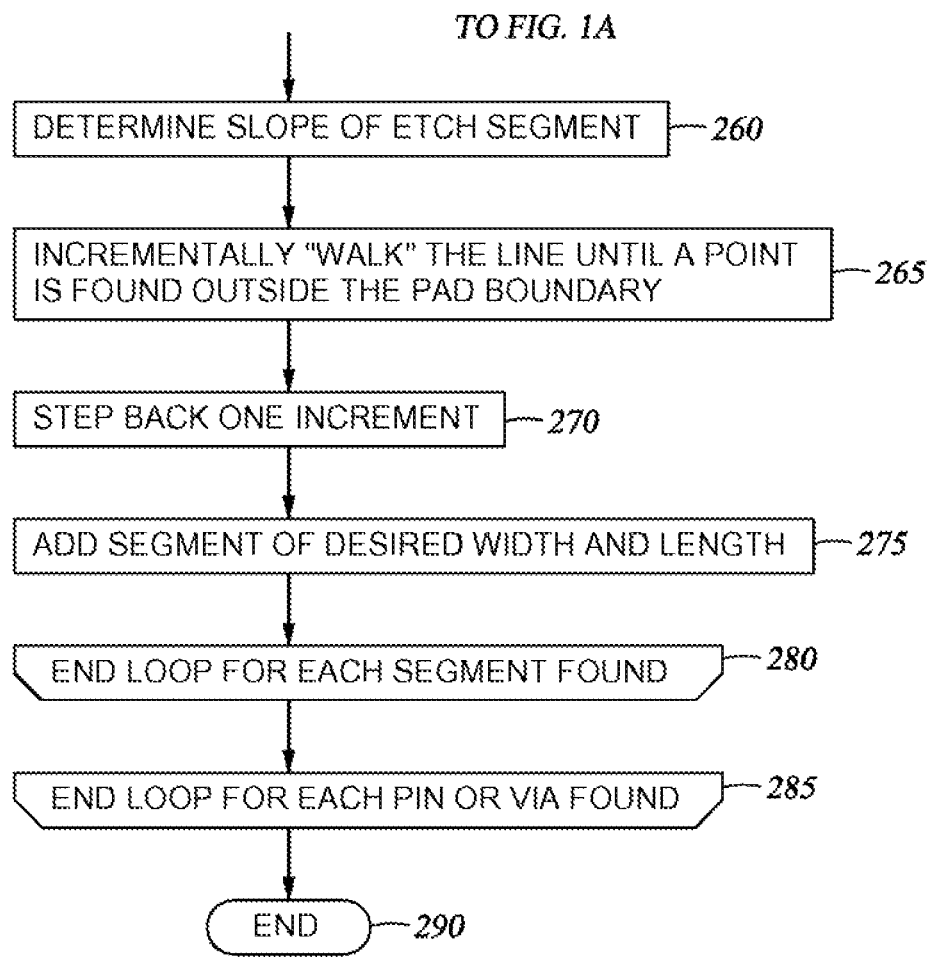

FIGS. 3A and 3B are collectively a flowchart illustrating a non-limiting embodiment of a method to deposit conductive material onto a circuit board. Various method embodiments of this method may include one or more of the steps from FIGS. 3A and 3B carried out in any order as desired. It should be understood that any embodiments of these various methods or computer implemented methods may be carried out by an information handling system (IHS).

At step 200, the IHS may accept the commands initiated by a user. Step 205 includes setting the top and bottom layers visible. One non-limiting embodiment of this disclosure may provide for the deposit of conductive material to form a land when the land is on a top or bottom layer of the circuit board. During step 210, the IHS is instructed to set the find filter to identify terminals, or "pads" and "vias". At step 215, the method may prompt a user to define a selection box to set the criteria for selection. At step 217, only testable vias may be selected. As another non-limiting example, all pads may be selected and only vias that are testable and not to be covered by soldermask may be selected. The locations of various pads and vias meeting the criteria may then be determined at step 220. At step 225, a loop may be executed for each pad or via found. Then, at step 230, a check is made for "etch" endpoints within the pad boundary. Next, a determination is made at step 235 for a set of endpoints for each segment with at least one endpoint in a pad boundary. Step 240 begins a loop for each segment found. At step 245, an assessment is made as to whether both endpoints fall within the pad boundary. If the endpoints fall within the boundary, then at step 250, the etch segment is set to the desired width.

Continuing with FIGS. 3A and 3B, if it is determined at step 245, that both endpoints do not fall within the pad boundary, step 255 is to locate an endpoint that is within the pad boundary. Step 260 is to determine slope of the etch segment. Step 265 is to incrementally "walk" the line until a point is found outside the pad boundary, thus establishing the size of land to deposit. A provision is then made to step back one increment at step 270. According to step 275, a segment of conductive material of desired width and length is added. This is continued until a loop is completed for each pad and/or via found with the various loops ending at steps 280, 285 and 290. Of course, it should be understood that additional steps may be added before, after or between any of the steps shown in FIGS. 3A and 3B.

Some of the various embodiments of the present disclosure may provide solutions to allow processing of circuit boards in a lead free manufacturing process. In some of the various embodiments consideration is given to the size of a land. In certain embodiments, only lands under a certain size need to be considered. In some embodiments, only pads and vias that meet the conditions are affected. With some embodiments, addition of conductive material is made of a length of a specific size land from the center of the pad that extends along the land path past the soldermask opening. This approach may reduce or eliminate the spacing problems that can inhibit the adding of fillets to the pads and vias in highly constrained and dense printed circuit board designs.

Furthermore, methods of the present disclosure, detailed description and claims may be presented in terms of logic, software or software implemented aspects typically encoded on a variety of storage media or medium including, but not limited to, computer-readable storage medium/media, machine-readable storage medium/media, program storage medium/media or computer program product. Such storage media, having computer-executable instructions, may be handled, read, sensed and/or interpreted by an information handling system. Generally, computer-executable instructions, such as program modules, may include routines, programs, objects, components, data structures, and the like, which perform particular tasks, carry out particular methods or implement particular abstract data types. Those skilled in the art will appreciate that such storage media may take various forms such as cards, tapes, magnetic disks (e.g., floppy disk or hard drive) and optical disks (e.g., compact disk read only memory ("CD-ROM") or digital versatile disc ("DVD")). It should be understood that the given implementations are illustrative only and shall not limit the present disclosure.

The present disclosure is to be taken as illustrative rather than as limiting the scope or nature of the claims below. Numerous modifications and variations will become apparent to those skilled in the art after studying the disclosure, including use of equivalent functional and/or structural substitutes for elements described herein, use of equivalent functional couplings for couplings described herein, and/or use of equivalent functional actions for actions described herein. Any insubstantial variations are to be considered within the scope of the claims below.

What is claimed is:

1. A computer implemented method of processing a circuit board design, the method comprising:
   providing the circuit board design on a computer, the circuit board design having disposed thereon a pattern, the pattern comprising a trace terminating at a terminal and forming a land extending away from the terminal;
   determining size of a land based on location of a pad boundary; and
   setting width of the land in the circuit board design to a desired width.

2. The method of claim 1, wherein the terminal is a via, and the step of setting the width of the land occurs when the land is under a predetermined size.

3. The method of claim 1, wherein the terminal is a via, and the step of setting the width of the land occurs if the via is not covered by soldermask during the manufacture of the circuit board.

4. The method of claim 1 further comprising:
   determining whether the terminal is a pad or a via.

5. The method of claim 4, wherein if the terminal is a via, the step of setting the width or a length of the land occurs if the via is not covered by soldermask during the manufacture of the circuit board.

6. The method of claim 1, wherein setting the width of the land comprises setting an etch segment within the circuit board design to a desired width.

7. The method of claim 1, wherein setting the width of the land in the circuit board design to a desired width comprises increasing the width of the land.

8. A computer-readable storage medium having executable instructions that when executed by an information handling system will carry out a method of processing a circuit board design having disposed thereon a pattern, the pattern comprising a trace terminating at a terminal and forming a land extending away from the terminal, the method comprising:
   locating the terminal;
   identifying the terminal meeting criteria to obtain a selected terminal; and
   setting width of the land in the circuit board design to a desired width.

9. The storage medium of claim 8, wherein the terminal is a via, and the step of setting the width of the land occurs when the via is not covered by soldermask during the manufacture of the circuit board.

10. The storage medium of claim 8, further including an executable instruction to request criteria from a user prior to identifying the terminals.

11. The storage medium of claim 8, wherein the terminal is a via, and the step of setting the width of the land occurs when the land is under a predetermined size.

12. The storage medium of claim 8 further including an executable instruction for the method further comprising determining whether the terminal is a pad or a via.

13. The storage medium of claim 12, wherein if the terminal is a via, the step of setting the width or the length of the land occurs if the via is not covered by soldermask during the manufacture of the circuit board.

14. The storage medium of claim 8, wherein setting the width of the land comprises setting an etch segment within the circuit board design to a desired width.

15. The storage medium of claim 8, wherein setting the width of the land in the circuit board design to a desired width comprises increasing the width of the land.

16. A computer implemented method of processing a circuit board design, the method comprising:
   providing the circuit board design on a computer, the circuit board design having disposed thereon a pattern, the pattern comprising a trace terminating at a terminal and forming a land extending away from the terminal;
   determining whether the terminal is a pad or a via; and
   if the terminal is a via, increasing width of the land on the circuit board design to a desired width.

17. The method of claim 16, wherein increasing the width of the land on the circuit board design occurs when the land is under a predetermined size.

18. The method of claim 16, wherein increasing the width of the land on the circuit board design occurs if the via is not covered by soldermask during the manufacture of the circuit board.

19. The method of claim 16, wherein increasing the width of the land on the circuit board design comprises setting an etch segment within the circuit board design to a desired width.

20. The method of claim 16 further comprising:
   depositing conductive material on the land and the trace during the manufacture of the circuit board.

* * * * *